(12) United States Patent
Motoya et al.

(10) Patent No.: US 8,420,209 B2
(45) Date of Patent: Apr. 16, 2013

(54) MULTILAYER CERAMIC SUBSTRATE

(75) Inventors: Machiko Motoya, Nagaokakyo (JP); Takahiro Sumi, Nagaokakyo (JP)

(73) Assignee: Murato Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/174,801

(22) Filed: Jul. 1, 2011

(65) Prior Publication Data

US 2012/0003450 A1    Jan. 5, 2012

(30) Foreign Application Priority Data

Jul. 5, 2010  (JP) ................. 2010-152713

(51) Int. Cl.
*B32B 7/02*    (2006.01)
(52) U.S. Cl.
USPC .......... 428/220; 428/212; 428/411.1
(58) Field of Classification Search .......... 428/220, 428/411.1, 212
See application file for complete search history.

(56) References Cited

U.S. PATENT DOCUMENTS

| | | | | |
|---|---|---|---|---|
| 3,837,869 | A * | 9/1974 | Bacher et al. | 501/15 |
| 6,517,924 | B1 | 2/2003 | Kameda et al. | |
| 2001/0022237 | A1 | 9/2001 | Suzuki et al. | |
| 2002/0061629 | A1 | 5/2002 | Nishide et al. | |
| 2008/0299325 | A1 * | 12/2008 | Davis et al. | 427/527 |
| 2011/0284270 | A1 | 11/2011 | Katsube et al. | |
| 2011/0300355 | A1 | 12/2011 | Katsube | |

FOREIGN PATENT DOCUMENTS

| | | |
|---|---|---|
| JP | 48-48999 A | 7/1973 |
| JP | 2002-094244 A | 3/2002 |
| JP | 2003-221277 A | 8/2003 |
| JP | 2003-347732 A | 12/2003 |
| JP | 3601671 B2 | 12/2004 |
| JP | 2005-298259 A | 10/2005 |
| JP | 2006-001755 A | 1/2006 |
| JP | 2008-053525 A | 3/2008 |
| JP | 2008-085040 A | 4/2008 |
| JP | 2008-270741 A | 11/2008 |
| JP | 2009-170566 A | 7/2009 |
| WO | 2010/079696 A1 | 7/2010 |
| WO | 2010/092970 A1 | 8/2010 |

OTHER PUBLICATIONS

Official Communication issued in corresponding European Patent Application No. 11172335.9, mailed on Jun. 26, 2012.
Official Communication issued in corresponding Japanese Patent Application No. 2010-152713, mailed on Nov. 6, 2012.

* cited by examiner

*Primary Examiner* — Maria Veronica Ewald
*Assistant Examiner* — Lawrence Ferguson
(74) *Attorney, Agent, or Firm* — Keating & Bennett, LLP

(57) ABSTRACT

In order to enable non-shrinkage firing, the strength of a multilayer ceramic substrate is increased by a method including alternately stacking a base material layer and a constrained layer which is not sintered at the sintering temperature for the base material layer, and allowing the material of the base material layer to flow into the constrained layer while subjecting the base material layer to sintering, thereby achieving densification of the constrained layer. The base material layer and the constrained layer each include celsian, and less celsian is provided in the base material layer than in the constrained layer. In order to increase the strength of the base material layer, the addition of a Ti component, rather than an increased content of Al component which interferes with sintering of the base material layer, causes fresnoite to be deposited in the base material layers.

3 Claims, 1 Drawing Sheet

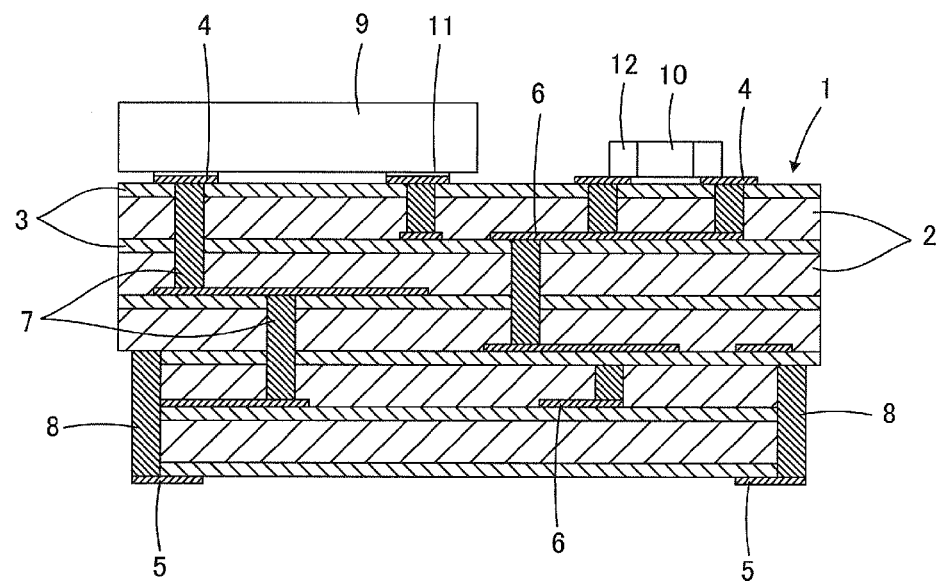

MULTILAYER CERAMIC SUBSTRATE

BACKGROUND OF THE INVENTION

1. Field of the Invention

The present invention relates to a multilayer ceramic substrate, and more particularly, to a multilayer ceramic substrate that has improved strength and is produced in accordance with a non-shrinkage process.

2. Description of the Related Art

Japanese Patent No. 3601671 describes a method for manufacturing a composite laminate, in which a first sheet layer including a first powder and a second sheet layer including a second powder which is not sintered at a sintering temperature for the first powder are alternately stacked, and in a firing step, the first powder is sintered, whereas the material of the first sheet layer is allowed to flow into the second sheet layer to fix the second powder. This manufacturing method has been attracting attention as a technique for manufacturing a multilayer ceramic substrate, which can prevent shrinkage in the direction of the principal surface.

When using the manufacturing method described above, the second sheet layer must be relatively thick so as to cause a constraining force to act sufficiently to prevent the first sheet layer from being shrunk, and at the same time, has to be thin enough to cause the material of the first sheet layer to flow for the densification.

In this regard, the applicant of the present application has proposed in Japanese Patent Application Laid-Open No. 2002-94244 that a constrained layer (the second sheet layer) allowed to contain a softened fluid powder (for example, glass) enables the constrained layer to be densified even when the constrained layer is thick. In this case, as the softened fluid powder, a powder is used which fails to soften or flow substantially at the shrinkage onset temperature of a ceramic raw material powder (the first powder) in a base material layer (the first sheet layer), but can soften or flow for the densification of the constrained layer at the completion of sintering.

However, even in the case of using the technique described in Japanese Patent Application Laid-Open No. 2002-94244, the constrained layer is formed such that it is thinner than the base material layer as in the case of the technique described in Japanese Patent No. 3601671.

As the ceramic raw material powder for use in the base material layer described above, a variety of glass ceramics can be used such as a glass-based low-temperature sintering ceramic material of an alumina powder mixed with borosilicate glass powder. However, because of the expensiveness of the glass powder, in the case of giving more consideration in terms of cost, for example, a non-glass based low-temperature sintering ceramic material is used which produces a glass component during the firing of a Ba—Al—Si based oxide ceramic or the like.

On the other hand, in the case of using a Ba—Al—Si based oxide ceramic the base material layer, an alumina powder mixed with a Ba—Al—Si based glass powder is used as a material for the constrained layer, because it is necessary to satisfy the requirement for the softened fluid powder described above (see, for example, Japanese Patent Application Laid-Open No. 2009-170566). It is to be noted that Japanese Patent Application Laid-Open No. 2009-170566 also discloses a structure in which a constrained layer is formed to be thinner than a base material layer.

However, it has been found that it is not possible to achieve a desirable substrate strength, when the materials as disclosed in Japanese Patent Application Laid-Open No. 2009-170566, specifically, the Ba—Al—Si based oxide ceramic, is used as the base material layer whereas the alumina powder and the Ba—Al—Si based glass powder are used as the constrained layer in the multilayer ceramic substrate for which the constrained layer is formed to be thinner than the base material layer, as described in Japanese Patent No. 3601671, Japanese Patent Application Laid-Open No. 2002-94244, and Japanese Patent Application Laid-Open No. 2009-170566.

SUMMARY OF THE INVENTION

Preferred embodiments of the present invention provide a multilayer ceramic substrate which solves the problems described above and has a further increased strength.

In order to identify the factor of the failure to achieve the desirable substrate strength, the inventors have paid attention to a crystal phase deposited after a firing step for obtaining a multilayer ceramic substrate. This is because the greater the fine crystal phase, the greater the substrate strength is improved. As a result, the inventors have discovered that, in spite of a thicker base material layer as compared with a constrained layer, and thus of the base material layer accounting for the higher thickness ratio of the whole substrate, the abundance of celsian ($BaAl_2Si_2O_8$), which is a fine crystal phase, is lower in the base material layer than in the constrained layer when attention is paid to the crystal phase present after firing.

The cause of the lower abundance of celsian in the base material layer as compared with the constrained layer is believed to be the lower content of the Al component in the base material layer as compared with the constrained layer. With the restriction of having to apply sintering solely to the base material layer while at the same time the constrained layer is not allowed to be subjected solely to sintering, the constrained layer is made to have a relatively large amount of alumina powder, whereas the based material layer is made to have a relatively small amount of alumina powder. Therefore, it is considered that the base material layer has a smaller amount of Al component as compared with the constrained layer, and as a result, celsian is less likely to be deposited in the base material layer. In this case, when the content of the Al component in the base material layer is increased for the purpose of depositing a lot of celsian, the base material layer will fail to be sintered.

Therefore, various preferred embodiments of the present invention are intended to, in brief, deposit fresnoite ($Ba_2TiSi_2O_8$) which is a fine crystal phase other than celsian, in the base material layer by the addition of a Ti component to the base material layer, thereby improving the substrate strength.

More specifically, the present invention is directed to a multilayer ceramic substrate including a section in which a first ceramic layer and a second ceramic layer that is thinner than the first ceramic layer are stacked alternately. In this multilayer ceramic substrate, the first ceramic layer and the second ceramic layer each include celsian, and the abundance of celsian is lower in the first ceramic layer than in the second ceramic layer. Furthermore, in order to solve the technical problems described above, the first ceramic layer of various preferred embodiments of the present invention preferably includes fresnoite.

The fresnoite has a crystal grain size equivalent to that of celsian, and has fine-grained crystals with a crystal grain size of about 0.5 μm, for example. Therefore, according to a preferred embodiment of the present invention, the fresnoite included in the first ceramic layer increases crystal grain boundaries in the first ceramic layer, and thus allows the development of cracking to be prevented, thereby allowing the strength of the multilayer ceramic substrate to be improved.

In a preferred embodiment of the present invention, when the second ceramic layer also includes fresnoite, the strength of the multilayer ceramic substrate can be further improved.

As described above, when the second ceramic layer also further includes fresnoite, the second ceramic layer defining the outermost layer is effective for the improvement of the strength, fracture toughness, and electrode peel strength of the multilayer ceramic substrate. More specifically, the strength properties of layers defining the outermost layers have a more dominant influence on the substrate strength, the fracture toughness, and the electrode peel strength, as compared with the strength properties of layers constituting the inner layers. In addition, the second ceramic layer is thinner as compared with the first ceramic layer, and the abundance ratio of fresnoite is thus higher in the second ceramic layer even when the fresnoite is deposited in the same way. With all these factors, when the second ceramic layer also includes fresnoite, the second ceramic layer defining the outermost layer is effective for the improvement of the strength, fracture toughness, and electrode peel strength as described above.

It is to be noted that when the first ceramic layer defines a base material layer whereas the second ceramic layer defines a constrained layer, the second ceramic layer needs to be a substantially thinner layer than the first ceramic layer in terms of sinterability, and the strength of the first ceramic layer is thus believed to have a dominant influence on the strength of the multilayer ceramic substrate as a sintered body. Therefore, when only the second ceramic layer includes fresnoite, the improvement of the substrate strength is not able to be expected so much.

The above and other elements, features, steps, characteristics and advantages of the present invention will become more apparent from the following detailed description of the preferred embodiments with reference to the attached drawings.

BRIEF DESCRIPTION OF THE DRAWINGS

The FIGURE is a cross-sectional view illustrating a multilayer ceramic substrate 1 according to a preferred embodiment of the present invention.

DETAILED DESCRIPTION OF THE PREFERRED EMBODIMENTS

With reference to the FIGURE, a multilayer ceramic substrate 1 according to a preferred embodiment of the present invention will be described.

The multilayer ceramic substrate 1 preferably includes a plurality of base material layers 2 as first ceramic layers and a plurality of constrained layers 3 as second ceramic layers stacked alternately on each other. The constrained layers 3 are thinner than the base material layers 2. In addition, in this preferred embodiment, the constrained layers 3 are arranged to define outermost layers. It is to be noted that while the multilayer ceramic substrate 1 shown in the FIGURE preferably has the structure of the plurality of base material layers 2 and the plurality of constrained layers 3 stacked alternately throughout the area in the stacking direction, a section may be present partially in the stacking direction without having this alternately stacked structure.

The multilayer ceramic substrate 1 is provided with various conductor patterns in connection with specific ones of the base material layers 2 and of the constrained layers 3. The conductor patters include several external conductor films 4 provided on the upper surface of the multilayer ceramic substrate 1, several external conductor films 5 likewise provided on the lower surface thereof, several internal conductor films 6 arranged along the interfaces between the base material layer 2 or the constrained layer 3 and the layer adjacent to the base material layer 2 or the constrained layer 3, and several via hole conductors 7 arranged to pass through specific one(s) of the base material layers 2 and/or the constrained layers 3, which serve as interlayer connecting conductors. In addition, several terminal conductors 8 are arranged so as to be connected to the external conductor films 5 located on the lower surface and exposed at the side surfaces. The terminal conductors 8 are formed preferably by exposing side surfaces of via hole conductors.

The external conductor films 4 located on the upper surface are used for connection to electronic components 9 and 10 to be mounted onto the upper surface. The FIGURE illustrates the electronic component 9 including bump electrodes 11, for example, like a semiconductor device, and the electronic component 10 including flat terminal electrodes 12, for example, like a chip capacitor. In addition, the external conductor films 5 provided on the lower surface are used for connection to a mother board (not shown) on which this multilayer ceramic substrate 1 is to be mounted.

This multilayer ceramic substrate 1 is obtained by firing a raw laminate. The raw laminate includes base material green layers defining the base material layers 2, constrained green layers defining the constrained layers 3, as well as the internal conductor films 6, the via hole conductors 7, and the terminal conductors 8 made of a conductive paste, and in some cases, further includes the external conductor films 4 and 5 preferably made of a conductive paste.

The base material green layers included in the raw laminate described above are provided by green sheets for defining base material layers, which are obtained by applying a doctor blade method for shape forming of a ceramic slurry, for example, on a carrier film composed of an organic resin such as polyethylene terephthalate.

The constrained green layers are also provided by green sheets for defining constrained layers, which are obtained by shape forming of a ceramic slurry. The green sheets for defining constrained layers may be independently subjected to shape forming, and then to a stacking step along with the green sheets for defining base material layers, or may be subjected to shape forming on the green sheets for defining base material layers, and to a stacking step as composite sheets with the green sheets for defining base material layers and the green sheets for defining constrained layers attached to each other.

The ceramic slurry used for the formation of the green sheets for defining base material layers can be obtained preferably by the addition of an organic binder such as polyvinyl butyral, a solvent such as toluene and isopropyl alcohol, a plasticizer such as di-n-butyl phthalate, and if necessary, other additives such as a dispersant, to a low-temperature sintering ceramic material, for the formation of a slurry.

As the low-temperature sintering ceramic material contained in the green sheets for defining base material layers, a low-temperature sintering ceramic material is advantageously used which includes a main constituent ceramic material containing, for example, about 20 weight % to about 40 weight % of Ba in terms of BaO, about 5 weight % to about 20 weight % of Al in terms of $Al_2O_3$, and about 48 weight % to about 75 weight % of Si in terms of $SiO_2$, and includes an accessory constituent ceramic material containing, for example, about 2 parts to about 10 parts by weight of Mn in terms of MnO and about 0.1 part to about 10 parts by weight of Ti in terms of $TiO_2$ with respect to 100 parts by weight of the main constituent ceramic material.

In this case, it is important that a Ti component be added as described above to the low-temperature sintering ceramic material contained in the green sheets for defining base material layers. This addition allows a fine crystal phase other than celsian, fresnoite to be deposited in the base material layers 2.

On the other hand, the ceramic slurry used for the formation of the green sheets for defining constrained layers can be obtained by the addition of an organic binder, a solvent, and a plasticizer to a ceramic material which is not substantially sintered at the sintering temperature of the low-temperature sintering ceramic material mentioned above, for the formation of a slurry.

As the ceramic material contained in the green sheets for defining constrained layers, a material is advantageously used which includes, for example, about 40 weight % to about 75 weight % of $Al_2O_3$ and about 25 weight % to about 60 weight % of glass containing about 10 weight % to about 30 weight % of Ba in terms of BaO, about 2 weight % to about 10 weight % of Al in terms of $Al_2O_3$, and about 40 weight % to about 65 weight % of Si in terms of $SiO_2$, about 2 weight % to about 15 weight % of B in terms of $B_2O_3$, about 0 weight % to about 15 weight % of Ca in terms of CaO, about 0 weight % to about 10 weight % of Mg in terms of MgO, and about 0 weight % to about 10 weight % of Ti in terms of $TiO_2$.

While the contents of Ca, Mg, and Ti in the green sheets for defining constrained layers can be about 0 weight % as described above, the addition of a Ti component allows a fine crystal phase other than celsian, fresnoite to be also deposited in the constrained layers 3.

The internal conductor films 6, the via hole conductors 7, and the terminal conductors 8 are provided, before stacking, on the ceramic green sheets for defining base material layers, the green sheets for defining constrained layers, or the composite sheets. The external conductor films 4 and 5 are also provided, before stacking, on the ceramic green sheets for defining base material layers, the green sheets for defining constrained layers, or the composite sheets, if necessary. Screen printing of a conductive paste is applied to the formation of the internal conductor films 6 and of the external conductor films 4 and 5. The respective steps of forming through holes and filling the through holes with a conductive paste are carried out for the formation of the via hole conductors 7. The respective steps of forming through holes, filling the through holes with a conductive paste, and dividing the conductive paste filling the through holes are carried out for the formation of the terminal conductors 8.

As the conductive paste described above, for example, a paste is used which contains a low melting point metal material such as gold, silver, or copper as a main constituent of its conductive component. Among the low melting point metal materials of gold, silver, or copper, in particular, the use of a conductive paste containing copper as its main constituent is superior in terms of simultaneous sinterability.

The green sheets for defining base material layers and the green sheets for defining constrained layers are stacked in a predetermined order, and subjected to pressure bonding with a pressure of, for example, about 1000 $kgf/cm^2$ to about 1500 $kgf/cm^2$ applied in the stacking direction to provide a raw laminate. This raw laminate may be provided with, not shown, a cavity to house other electronic components, and with a connection to fix a cover covering the electronic components 8 and 9.

The raw laminate is subjected to firing in a temperature range not less than the temperature at which the ceramic material contained in the ceramic green layers can be sintered, for example, about 850° C. or more, and not more than the melting point of the metal contained in the conductor patterns, for example, about 1050° C. or less in the case of copper. This firing makes the ceramic green layers sintered, and also makes the conductive paste sintered, thereby providing the multilayer ceramic substrate 1 with the sintered conductive patterns. Then, the electronic components 9 and 10 are mounted.

In the firing step described above, the green sheets for defining constrained layers act to prevent the shrinkage of the green sheets for defining base material layers in the direction of the principal surface, because the green sheets for defining constrained layers are not substantially sintered, and thus have no shrinkage caused by sintering. Therefore, the obtained multilayer ceramic substrate 1 achieves an increased dimensional accuracy. In addition, in the fired multilayer ceramic substrate 1, the material of the base material layers 2 partially flowing into the constrained layers 3 thus fixes the ceramic powder contained in the constrained layers 3, thereby resulting in densification of the constrained layers 3.

In the obtained multilayer ceramic substrate 1, the base material layers 2 and the constrained layers 3 each includes celsian as a crystal phase. However, the abundance of celsian is lower in the base material layers 2 than the constrained layers 3. This is presumed to be because the content of Al component is lower in the base material layers 2 as compared with the constrained layers 3.

In addition, because of the Ti component added to the base material layers 2, the base material layers 2 further include fresnoite as a crystal phase. The base material layers 2 include, as crystal phases, alumina ($Al_2O_3$) and quartz ($SiO_2$) in addition to the celsian and fresnoite mentioned above, and the rest is glass as an amorphous component. As described above, while the green sheets for defining base material layers include no glass as a starting component, the fired base material layers 2 include glass because the glass as an amorphous component is produced in the firing step.

The constrained layers 3 include, as crystal phases, alumina in addition to the celsian mentioned above, and the rest is an amorphous component. In addition, when the constrained layers 3 contain the Ti component, the constrained layers 3 also include fresnoite.

The fresnoite mentioned above has a crystal grain size equivalent to that of celsian, and includes fine-grained crystals with a crystal grain size of about 0.5 µm, for example. Therefore, the presence of fresnoite increases crystal grain boundaries in the base material layers 2, and thus allows the development of cracking to be prevented, thereby allowing the strength of the multilayer ceramic substrate 1 to be improved. In addition, when the constrained layers 3 also include fresnoite therein, the strength of the multilayer ceramic substrate 1 can be further improved.

In addition, when the constrained layers 3 also include fresnoite therein, the constrained layers 3 placed in the outermost layers as in the case of this preferred embodiment are effective for the improvement in the strength, fracture toughness, and electrode peel strength of the multilayer ceramic substrate 1.

Further, when the main constituent metal contained in the conductor patterns is copper, the firing is carried out in a non-oxidizing atmosphere such as a nitrogen atmosphere, for example, in such a way that the removal of the binder is completed at a temperature of about 900° C. or less, and the copper is not substantially oxidized at the completion of the firing by decreasing the oxygen partial pressure with decrease in temperature. Further, when the firing temperature is, for example, about 980° C. or more, it is difficult to use silver as the metal contained in the conductor patterns. However, it is possible to use, for example, an Ag—Pd based alloy containing about 20 weight % or more of palladium. In this case, the firing can be carried out in air. When the firing temperature is, for example, about 950° C. or less, silver can be used as the metal contained in the conductor patterns.

Experimental Example

Next, an experimental example will be described which was carried out for confirming the advantageous effects of preferred embodiments of the present invention.

(1) Preparation of Green Sheets for Defining Base Material Layers

As starting raw materials, respective powders of $SiO_2$, $BaCO_3$, $Al_2O_3$, $ZrO_2$, $CaCO_3$, $B_2O_3$, $MnCO_3$, $TiO_2$, and $Mg(OH)_2$ were prepared each with a grain size of 2.0 μm or less. Next, these starting raw material powders were weighed so as to provide the composition ratios shown in Table 1, and subjected to wet mixing and grinding, and then to drying, and the obtained mixture was subjected to calcination at 750° C. to 1000° C. for 1 to 3 hours to obtain raw material powders for base material layers. The $BaCO_3$ was turned into BaO after the firing, the $CaCO_3$ was turned into CaO after the firing, the $MnCO_3$ was turned into MnO after the firing, and the $Mg(OH)_2$ was turned into MgO after the firing. It is to be noted that the respective starting raw material powders are shown in terms of weight % in Table 1.

TABLE 1

| Symbol for Composition of Base Material Layer | Main Constituent Ceramic Material | | | Accessory Constituent Ceramic Material | | | | | |
|---|---|---|---|---|---|---|---|---|---|
| | $SiO_2$ | BaO | $Al_2O_3$ | CaO | $B_2O_3$ | MnO | $TiO_2$ | MgO | $ZrO_2$ |
| S-1 | 53.0 | 27.0 | 11.0 | 6.0 | 3.0 | — | — | — | — |
| S-2 | 53.0 | 27.0 | 11.0 | — | — | 5.0 | 1.0 | 2.0 | 1.0 |
| S-3 | 53.0 | 27.0 | 11.0 | — | — | 4.5 | 2.5 | 1.0 | 1.0 |
| S-4 | 53.0 | 27.0 | 11.0 | — | — | 4.0 | 4.0 | 0.5 | 0.5 |

Next, appropriate amounts of organic binder, dispersant, and plasticizer were added to the raw material powders for base material layers to prepare ceramic slurry, and the ceramic slurry was then subjected to mixing and grinding so as to provide an average grain size (D50) of 1.5 μm or less for the raw material powder in the slurry. Next, the ceramic slurry was formed by a doctor blade method into the shape of a sheet, and dried to obtain green sheets S-1 to S-4 for base material layers with a post-firing thickness of 15 μm.

(2) Preparation of Green Sheets for Defining Constrained Layers

As starting raw materials, respective powders of $Al_2O_3$ and $TiO_2$ were prepared each with a grain size of 2.0 μm or less, and glass powders G-1 to G-4 were prepared which had the compositions shown in Table 2. It is to be noted that the compositions of the glass powders are shown in terms of weight % in Table 2.

TABLE 2

| Symbol for Glass for Constrained Layer | $SiO_2$ | BaO | $Al_2O_3$ | CaO | MgO | $B_2O_3$ | $TiO_2$ |
|---|---|---|---|---|---|---|---|
| G-1 | 51.0 | 24.0 | 6.0 | 9.0 | 5.0 | 5.0 | — |
| G-2 | 51.0 | 21.0 | 8.0 | 10.0 | — | 8.0 | 2.0 |
| G-3 | 52.0 | 22.0 | 6.0 | 9.0 | — | 7.0 | 4.0 |
| G-4 | 52.0 | 24.0 | 6.0 | — | 5.5 | 7.0 | 5.5 |

Next, these starting raw material powders were weighed so as to provide the composition ratios shown in Table 3, appropriate amounts of organic binder, dispersant, and plasticizer were added to the weighed powders to prepare ceramic slurry, and the ceramic slurry was then subjected to mixing and grinding so as to provide an average grain size (D50) of 1.5 μm or less for the raw material powder in the slurry. Next, the ceramic slurry was formed by a doctor blade method into the shape of a sheet, and dried to obtain green sheets R-1 to R-5 for constrained layers with a post-firing thickness of 5 μm. It is to be noted that the respective starting raw material powders are shown in terms of weight % in Table 3.

TABLE 3

| Symbol for Composition of Constrained Layer | Ceramic Material | | Glass for Constrained Layer | | | |
|---|---|---|---|---|---|---|
| | $Al_2O_3$ | $TiO_2$ | G-1 | G-2 | G-3 | G-4 |
| R-1 | 55.0 | — | 45.0 | — | — | — |
| R-2 | 55.0 | — | — | 45.0 | — | — |
| R-3 | 55.0 | — | — | — | 45.0 | — |
| R-4 | 55.0 | — | — | — | — | 45.0 |
| R-5 | 52.0 | 3.0 | 45.0 | — | — | — |

(3) Preparation of Raw Laminate Sample

Any one of the green sheets S-1 to S-4 for base material layers, prepared in the step (1), and any one of the green sheets R-1 to R-5 for defining constrained layers, prepared in the step (2), were selected as shown in the column "Before Sintering" of Table 4, and the selected respective green sheets for defining base material layers and green sheets for defining constrained layers were stacked alternately. For this stacking, the green sheets for defining constrained layers were arranged to define the outermost layers. It is to be noted that as can be determined from Tables 1 through 3, the presence or absence of Ti component contained is shown for each of the green sheets for defining base material layers and the green sheets for defining constrained layers in the respective columns "Presence or Absence of Ti Component in Base Material Layers" and "Presence or Absence of Ti Component in Constrained Layers" in the column "Before Sintering" of Table 4, in order to allow more speedy determinations.

Next, after the stacking described above, thermocompression bonding was carried out under the conditions of temperature: 60° C. to 80° C. and pressure: 1000 to 1500 kg/cm² to obtain a raw laminate. Then, the raw laminate was cut to provide a raw laminate sample, so that a ceramic sintered body was provided with a size of 30.0 mm×4.5 mm×1.0 mm (thickness) after firing.

(4) Preparation of Ceramic Sintered Body Sample

Next, the raw laminate sample was subjected to firing at the maximum temperature of 980° C. in a non-oxidizing atmosphere of nitrogen-hydrogen, thereby providing a plate-shaped ceramic sintered body sample.

Further, the obtained ceramic sintered body sample was subjected to polishing so as to expose a cross section thereof, and the thicknesses of the base material layer and of the constrained layer were measured with the use of a scanning microscope. Then, it has been confirmed that the base material layer is 15 μm in thickness, whereas the constrained layer is 5 μm in thickness.

(5) Evaluations

Next, as shown in the column "After Sintering" of Table 4, the fracture toughness value, the substrate strength, and the electrode peel strength were obtained for the obtained ceramic sintered body samples, and the ceramic sintered body samples were evaluated for the presence or absence of fresnoite and the abundance thereof. More details on the measurement or evaluation methods are as follows.

base material layer and the constrained layer include celsian therein for all of the samples, and the abundance of celsian is lower in the base material layer than in the constrained layer.

TABLE 4

| | Before Sintering | | | | | | | | | | | |
|---|---|---|---|---|---|---|---|---|---|---|---|---|
| | | | Presence or Absence of Ti Component | Presence or Absence of Ti Component | | Presence or Absence of Fresnoite | | The Abundance of Fresnoite | | | | Electrode |
| Sample Number | Symbol for Composition of Constrained Layer | Symbol for Composition of Base Material Layer | in Constrained Layers | in Base Material Layer | Classification | Constrained Layer | Base Material Layer | Constrained Layer | Base Material Layers | Fracture Toughness Value | Substrate Strength (MPa) | Peel Strength (N) |
| 1 | R-1 | S-1 | Absent  | Absent  | F0 | Absent  | Absent  | E | E | 0.91 | 240 | 19.3 |
| 2 | R-1 | S-2 | Absent  | Present | F1 | Absent  | Present | E | C | 1.07 | 265 | 25.3 |
| 3 | R-1 | S-3 | Absent  | Present | F1 | Absent  | Present | E | B | 1.12 | 272 | 26.9 |
| 4 | R-1 | S-4 | Absent  | Present | F1 | Absent  | Present | E | A | 1.17 | 280 | 28.8 |
| 5 | R-2 | S-3 | Present | Present | F2 | Present | Present | C | B | 1.42 | 319 | 38.1 |
| 6 | R-3 | S-3 | Present | Present | F2 | Present | Present | B | B | 1.51 | 333 | 41.5 |
| 7 | R-4 | S-3 | Present | Present | F2 | Present | Present | A | B | 1.56 | 340 | 43.1 |
| 8 | R-5 | S-3 | Present | Present | F2 | Present | Present | B | B | 1.48 | 328 | 40.0 |
| 9 | R-4 | S-4 | Present | Present | F2 | Present | Present | A | A | 1.65 | 352 | 46.1 |

Fracture Toughness Value

The surface of the ceramic sintered body sample was provided with indentation produced by a Vickers indenter under the condition of 500 gf×15 seconds, and the fracture toughness value $K_{IC}$ was calculated from the size of the indentation and the length of the crack.

Substrate Strength

The substrate strength of the ceramic sintered body sample was evaluated by a three-point bending test (JIS-R1061).

Electrode Peel Strength

A cubic electrode of 2 mm on a side was formed on the surface of the ceramic sintered body sample, an L-shaped lead was soldered onto the cubic electrode, and the joint strength between the sample and the electrode was measured as the electrode peel strength by a tension test in a perpendicular direction with respect to the surface of the sample.

Presence or Absence of Fresnoite

Polishing was carried out so as to expose a cross section of the ceramic sintered body sample, and the constituent elements of the crystals were quantitatively evaluated from an EDX point analysis under a transmission-type microscope to identify fresnoite for each of the constrained layer and of the base material layer.

The Abundance of Fresnoite

Polishing was carried out so as to expose a cross section of the ceramic sintered body sample, and a transmission-type microscope was used to count the number of fresnoite crystals per area of 4.0 μm×5.0 μm. The counting was carried out on five points for each of the constrained layer and of the base material layer, and the averaged value for the five points was regarded as the abundance of fresnoite. In the column "The Abundance of Fresnoite" of Table 4, symbols "A", "B", "C", "D", and "E" are shown respectively when the number of fresnoite crystals per area of 4.0 μm×5.0 μm is 6 or more, likewise 4 or more and less than 6, likewise 2 or more and less than 4, likewise 1, and likewise 0.

Further, evaluations were also made on the presence or absence of celsian and the abundance of celsian in accordance with the same evaluation methods as in the case of the fresnoite described above, and it has been determined that the In the column "Classification" in the column "After Sintering" of Table 4, symbols "F0", "F1", and "F2" are shown according to the presence or absence of fresnoite. The symbol "F0" indicates that the base material layer and constrained layer of the ceramic sintered body sample both include no fresnoite therein, the symbol "F1" indicates that the constrained layer includes no fresnoite therein, whereas the base material layer includes fresnoite therein, and the symbol "F2" indicates that the base material layer and the constrained layer both include fresnoite therein.

Sample 1 is classified into "F0", samples 2 to 4 are classified into "F1", and samples 5 to 9 are classified into "F2".

(6) Consideration

Comparison of Substrate Strength among "F0", "F1", and "F2"

As compared with sample 1 classified into "F0", samples 2 to 9 classified into "F1" or "F2" each have a higher substrate strength. This is believed to be because the addition of the $TiO_2$ component to the green sheets for defining base material layers before sintering resulted in the deposition of fresnoite in the base layers after sintering, thus improving the substrate strength. Moreover, as compared with samples 2 to 4 classified into "F1", samples 5 to 9 classified into "F2" have a higher substrate strength. This is believed to be because samples 5 to 9 each have fresnoite deposited not only in the sintered base material layers but also in the sintered constrained layers, thus improving the substrate strength.

From the results described above, it can be confirmed that when the fresnoite is deposited solely in the base material layers, the substrate strength is improved, and when the fresnoite is deposited not only in the base material layers but also in the constrained layers, the substrate strength is further improved.

Relationship Between Composition of Base Material Layer and the Abundance of Fresnoite and Substrate Strength For samples 2 to 4, the $TiO_2$ component was added to the green sheets for defining base material layers before sintering while varying the additive amount of the $TiO_2$ component among samples 2 to 4, and the green sheets for defining constrained layers before sintering, containing no $TiO_2$ component, were common in samples 2 to 4.

As can be seen from the comparison among samples 2 to 4, with the increase in the additive amount of $TiO_2$ in the green sheets for defining base material layers before sintering, the abundance of fresnoite in the base material layers after sintering is increased to make an improvement in substrate strength.

Relationship Between Composition of Constrained Layer and the Abundance of Fresnoite and Substrate Strength For samples 5 to 9, the $TiO_2$ component was added to the green sheets for defining constrained layers before sintering while varying the additive amount of the $TiO_2$ component among samples 5 to 9. More specifically, the $TiO_2$ component was added as $TiO_2$ based glass for samples 5 to 7 and 9, whereas the $TiO_2$ component was added as a $TiO_2$ oxide for sample 8.

As can be seen from the comparison among samples 5 to 7 and 9, with the increase in the amount of $TiO_2$ contained in the glass in the green sheets for defining constrained layers before sintering, the abundance of fresnoite in the constrained layers after sintering is increased to make an improvement in substrate strength.

In addition, even in the case of a $TiO_2$ oxide added to the green sheets for defining constrained layers before sintering as in the case of sample 8, the abundance of fresnoite in the constrained layers after sintering is increased to make an improvement in substrate strength, as compared with sample 3 containing no $TiO_2$ component in the green sheets for defining constrained layers before sintering. Therefore, even when the $TiO_2$ component added to the constrained layers is an oxide, the oxide can be said to be effective for the deposition of fresnoite.

Fracture Toughness and Electrode Peel Strength

The substrate strength described above is substantially correlated with the fracture toughness value and the electrode peel electrode, and when the substrate strength is improved, the fracture toughness value and the electrode peel electrode are also improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic substrate comprising:
    a section in which a first ceramic layer and a second ceramic layer that is thinner than the first ceramic layer are stacked alternately, wherein the first ceramic layer and the second ceramic layer each comprise celsian ($BaAl_2Si_2O_8$), an amount of celsian is lower in the first ceramic layer than in the second ceramic layer, and the first ceramic layer further includes fresnoite ($Ba_2TiSi_2O_8$); and
    a total number of fresnoite crystals per area of 4.0 μm×5.0 μm of the first ceramic layer is about 2 or more.

2. The multilayer ceramic substrate according to claim 1, wherein the second ceramic layer further comprises fresnoite.

3. The multilayer ceramic substrate according to claim 2, wherein the second ceramic layer defines an outermost layer.

\* \* \* \* \*